United States Patent
Cho et al.

(10) Patent No.: US 7,512,010 B2
(45) Date of Patent: Mar. 31, 2009

(54) VOLTAGE REGULATOR FOR FLASH MEMORY DEVICE

(75) Inventors: Ji-Ho Cho, Suwon-si (KR); Hyeok Kang, Gwangjang-gu (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 99 days.

(21) Appl. No.: 11/760,829

(22) Filed: Jun. 11, 2007

(65) Prior Publication Data
US 2007/0297238 A1    Dec. 27, 2007

(30) Foreign Application Priority Data
Jun. 15, 2006    (KR) .................. 10-2006-0054026

(51) Int. Cl.
*G11C 16/06*    (2006.01)
(52) U.S. Cl. .................. 365/185.23; 365/189.07; 365/189.11; 365/226
(58) Field of Classification Search ........... 365/185.23, 365/185.33, 189.11, 189.07, 226
See application file for complete search history.

(56) References Cited

U.S. PATENT DOCUMENTS

| | | | |
|---|---|---|---|
| 6,487,120 B2 | 11/2002 | Tanzawa et al. | |
| 6,498,761 B2 * | 12/2002 | Banba et al. ............. | 365/226 |
| 7,002,869 B2 | 2/2006 | Zhang et al. | |
| 2002/0118568 A1 * | 8/2002 | Tanzawa ............... | 365/185.11 |
| 2006/0285388 A1 * | 12/2006 | Ha et al. ............... | 365/185.18 |

FOREIGN PATENT DOCUMENTS

| | | |
|---|---|---|
| JP | 2001338493 | 12/2001 |
| JP | 2003015751 | 1/2003 |
| JP | 2004273103 | 9/2004 |
| KR | 1020040079119 A | 9/2004 |

* cited by examiner

*Primary Examiner*—Anh Phung
*Assistant Examiner*—Toan Le
(74) *Attorney, Agent, or Firm*—Volentine & Whitt, PLLC

(57) ABSTRACT

Provided is a voltage regulator of a flash memory device. Embodiments of the invention provide a voltage regulator that is configured to regulate either an internal pumping voltage or an external high voltage. In embodiments of the invention, the voltage regulator includes two switches having different switching current characteristics: when regulating the internal pumping voltage, the voltage regulator is configured to activate a switch having a relatively high switching current to output the regulated voltage; but when regulating the high external voltage, the voltage regulator is configured to activate a switch having a relatively low switching current to output the regulated voltage during at least a set-up time. In an embodiment of the invention, the voltage regulator may be configured to activate both switches to regulate the high external voltage after the set-up time. In yet another embodiment of the invention, after the set-up time, the voltage regulator may be configured to deactivate the switch having the relatively low switching current and activate the switch having the relatively high switching current to regulate the high external voltage.

20 Claims, 6 Drawing Sheets

VOLTAGE REGULATOR FOR FLASH MEMORY DEVICE

CROSS-REFERENCE TO RELATED APPLICATION

This U.S. non-provisional patent application claims priority under 35 U.S.C. § 119 of Korean Patent Application No. 10-2006-0054026, filed on Jun. 15, 2006, the entire contents of which are hereby incorporated by reference.

BACKGROUND OF THE INVENTION

1. Field of the Invention

The present invention disclosed herein relates to a semiconductor memory device, and more particularly, to a voltage regulator for a semiconductor memory device.

2. Description of the Related Art

Generally, a flash memory device needs a high voltage for programming and erasing data. Such a high voltage is generated through a charge pumping circuit provided in the flash memory device. The charge pumping circuit generates the high voltage by boosting an internal voltage Vcc using well-known charge pumping methods. Hereinafter, the high voltage, which has been boosted by the charge pumping circuit, is referred to as a pumping voltage. In general, the pumping voltage is outputted as a regulated voltage Vreg through a switching circuit such as a pass gate or the like. The regulated voltage Vreg is divided by a voltage divider. The divided voltage Vdiv is compared with a reference voltage Vref, and the switching circuit is then controlled depending on the comparison result. Consequently, the regulated voltage Vreg is maintained at a constant level through a feedback loop of the comparing and switching operations, and thus it can be supplied as a word line voltage having stable waveform such as a program voltage Vpgm, a program verify voltage Vvfy or the like.

However, besides the above-described method for generating the regulated voltage Vreg from the pumping voltage, a forcing mode, which directly receives a high voltage from an external source and then supplies it as a regulated voltage Vreg, is additionally provided in a NOR type flash memory device. For example, such a mode may include an accelerated program operation mode. In a mode where an external high voltage is provided, the high voltage is abruptly applied inward, which may cause the instability of the regulated voltage Vreg due to the large amount of input current. An overshoot and its resulting ripple voltage are representative features of the instability of the regulated voltage Vreg. FIG. 1 is a waveform diagram illustrating the instability of the regulated voltage Vreg generated when the external high voltage is provided. Referring to FIG. 1, a regulated voltage Vreg_pump generated by using a pumping voltage Vpp_pump has a gradually ascending slope without the overshoot and the ripple. That is, the regulated voltage Vreg_pump has a stable waveform that continuously rises up to a predetermined point that the pumping voltage Vpp_pump reaches a predetermined level from a start point (t=0) when the high voltage begins to be supplied. This waveform is ascribed to a predetermined time taken for boosting a voltage up to the high voltage through the charge pumping operation at the starting point when the high voltage begins to be supplied.

However, an external high voltage Vpp_ext provided from an external power source is always maintained at a constant voltage level, and a relatively high current is provided to the regulator circuit at a switching point. When the external high voltage has a predetermined waveform having a steep slope like a step pulse, the regulator circuit has a time response characteristic like an impulse wave. Therefore, a regulated voltage Vreg_ext obtained by regulating the external high voltage Vpp_ext has a short rising time, but it must be accompanied by an overshoot having a peak at time T1 and its resulting ripple. Herein, the ripple is due to a sensing delay due to the aforementioned feedback operation. An internal operation (e.g., program or verify operation) using the regulated voltage will begin because it is determined that the regulated voltage reaches a target voltage at time T1. However, when the regulated voltage Vreg is provided as the internal operation voltage (e.g., Vpgm, Vvfy, etc) at time T2, the regulated voltage lower than the target voltage will be supplied. When a program fail occurs due to the overshoot and the ripple, the number of iterations of a program loop is inevitably increased. This phenomenon is not merely limited to the program operation. For instance, the overshoot and the ripple may cause an operational error in the program verify operation, reading operation, and so forth.

SUMMARY OF THE INVENTION

Embodiments of the invention provide a voltage regulator that is configured to regulate either an internal pumping voltage or an external high voltage. In embodiments of the invention, the voltage regulator includes two switches having different switching current characteristics: when regulating the internal pumping voltage, the voltage regulator is configured to activate a switch having a relatively high switching current to output the regulated voltage; but when regulating the high external voltage, the voltage regulator is configured to activate a switch having a relatively low switching current to output the regulated voltage during at least a set-up time. In an embodiment of the invention, the voltage regulator may be configured to activate both switches to regulate the high external voltage after the set-up time. In yet another embodiment of the invention, after the set-up time, the voltage regulator may be configured to deactivate the switch having the relatively low switching current and activate the switch having the relatively high switching current to regulate the high external voltage.

Embodiments of the present invention provide a voltage regulator of a flash memory device, the voltage regulator configured to output a regulated voltage, the voltage regulator including: a selection circuit configured to receive and selectively output at least one of an external high voltage and an internal pumping voltage, the selection being in response to a mode signal, a first state of the mode signal associated with the internal pumping voltage and a second state of the mode signal associated with the external high voltage; a first switch coupled to an output of the selection circuit, the first switch having a first switching current; a second switch coupled to the output of the selection circuit, the second switch having a second switching current, the second switching current being different from the first switching current; and a switch control circuit coupled to the first switch and the second switch, the switch control circuit configured to select at least one of the first switch and the second switch in response to the mode signal, the switch control circuit further configured to control the at least one selected switch according to the regulated voltage.

According to technical features of respective constitutions according to the present invention, a voltage regulator of a flash memory device can provide a regulated voltage without an overshoot and a ripple into the device even during a mode when an external high voltage is supplied.

BRIEF DESCRIPTION OF THE DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Hereinafter, embodiments of the invention are described in conjunction with the accompanying drawings to fully explain the present invention in such a manner that it may easily be carried out by those skilled in the art to which the invention pertains.

Figure 1:
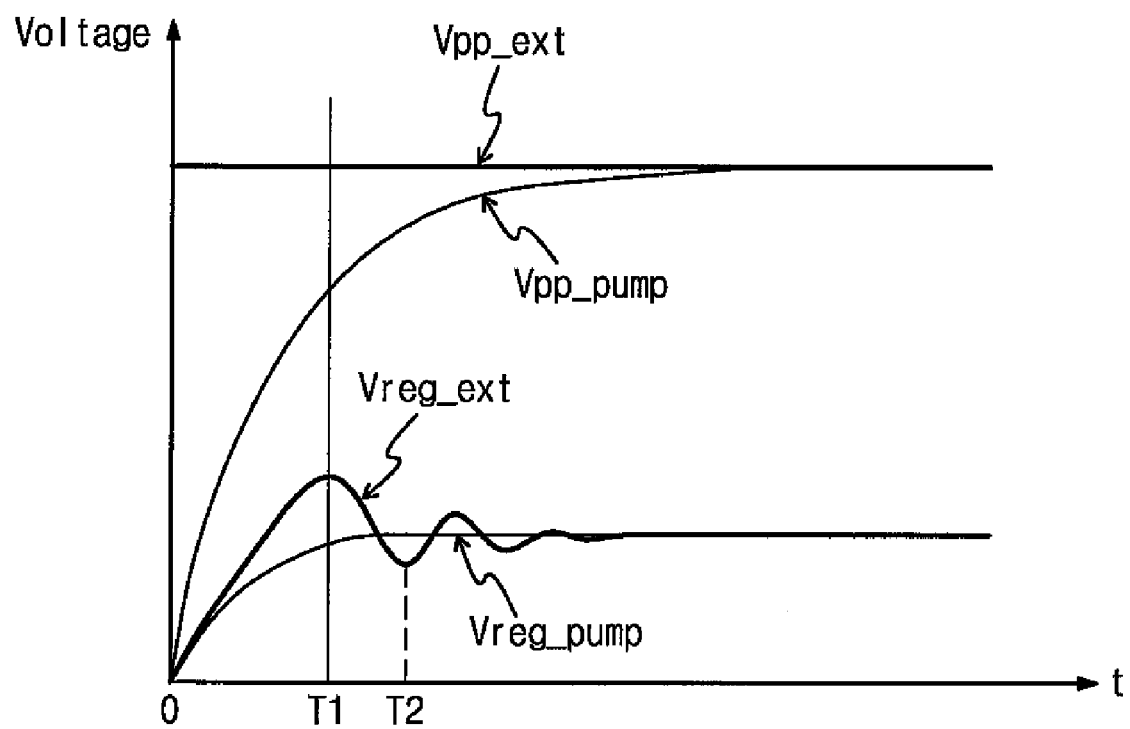
FIG. 1 is a waveform diagram illustrating a problem when an external high voltage is applied in a general voltage regulator.
Figure 2:
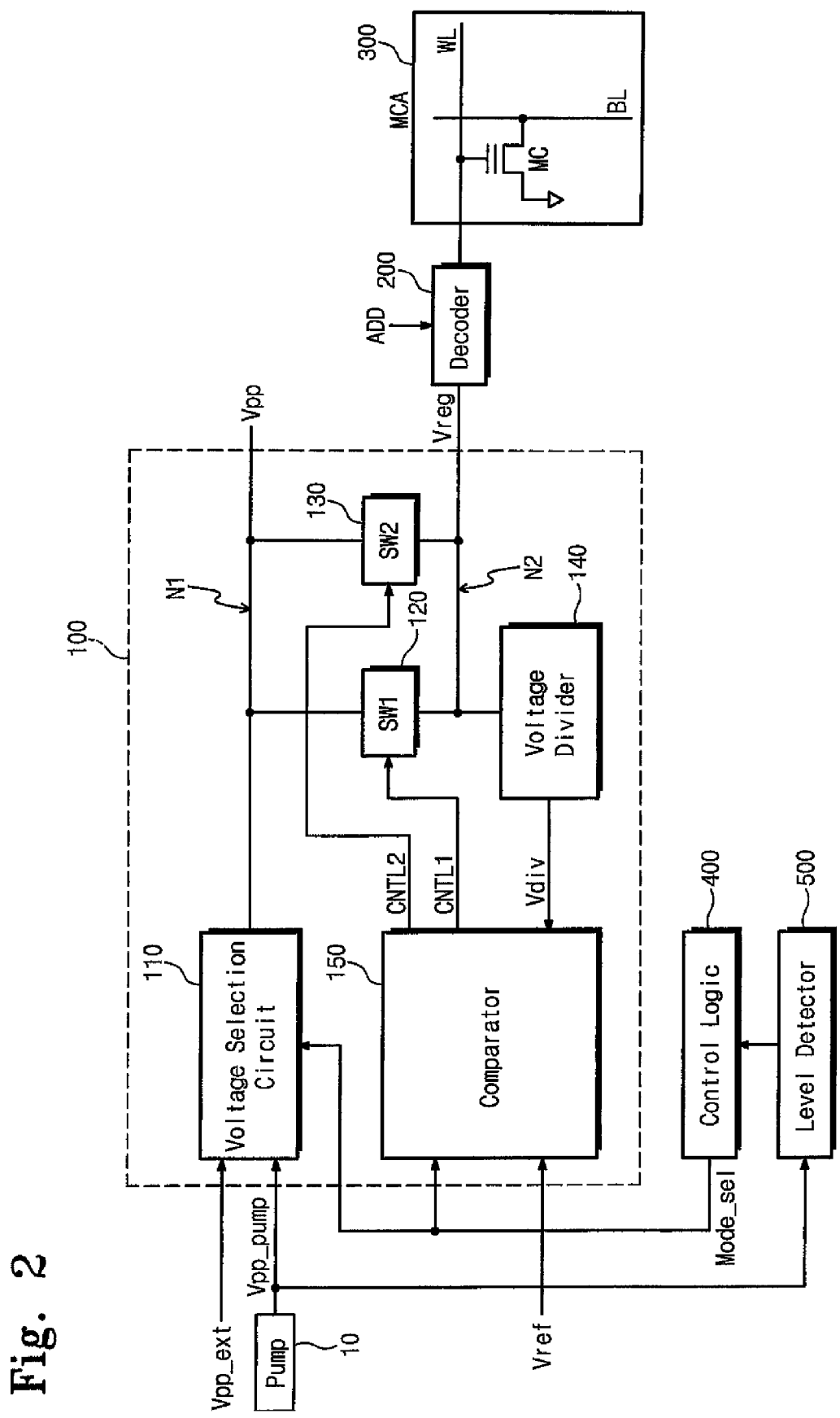
FIG. 2 is a block diagram of a semiconductor memory device including a voltage regulator according to an embodiment of the present invention.

FIG. 2 is a block diagram schematically illustrating a flash memory device according to an embodiment of the present invention. Referring to FIG. 2, a voltage regulator 100 of the flash memory device according to the present invention includes respective switches 120 and 130 with different magnitudes of switching current. The voltage regulator 100 of the present invention generates a regulated voltage Vreg at node N2 in which an overshoot and a ripple are removed even during an external high voltage mode, and it provides the regulated voltage Vreg to a decoder 200. A voltage regulator configuration and regulating operation will be illustrated below with reference to the accompanying drawings.

A pump circuit 10 receives an internal voltage Vcc and generates a pumping voltage Vpp_pump as a high voltage through a well-known pumping operation. Pump circuit 10 may be any known pump circuit, according to design choice.

A voltage selection circuit 110 receives a pumping voltage Vpp_pump generated inside the flash memory device and an external high voltage Vpp_ext provided from an external source, and selects one of input voltages Vpp_pump and Vpp_ext in response to a mode select signal Mode_sel. The voltage selected by the voltage selection circuit 110 is provided to a first node N1 as a high voltage Vpp. A pumping voltage Vpp_pump may be additionally supplied to the first node N1 together with the external high voltage Vpp_ext during the external high voltage mode, which will be illustrated more fully later.

A first switch 120 provides the high voltage Vpp applied to the first node N1 as a regulated voltage Vreg of a second node N2 in response to a first switch control signal CNTL1. The second switch 130 transfers the high voltage Vpp applied to the first node N1 to the second node N2 in response to a second switch control signal CNTL2. However, the first switch 120 and the second switch 130 are constructed such that the magnitudes of switching current are not equal to each other. For example, the first switch 120 and the second switch 130 may be constituted as switching devices having different aspect ratios. Thus, they may be constituted as switching devices of which current passing capabilities (current drivabilities) are different from each other when the switching devices are turned on. That is, the first and second switches 120 and 130 can switch the current with different magnitudes depending on the selected mode, and thus it is possible to set the regulated voltage Vreg in which the overshoot and the ripple are removed.

A voltage divider 140 divides the regulated voltage Vreg set by the switching operations of the first and second switches 120 and 130 into predetermined voltage levels comparable with a reference voltage Vref, and it then outputs the divided voltage Vdiv as a division result.

A comparator 150 compares the divided voltage Vdiv with the reference voltage Vref, and controls the first and second switches 120 and 130 according to the comparison result. In the mode receiving the external high voltage Vpp_ext, the comparator 150 generates the first switch control signal CNTL1 so as to turn on the first switch 120 with small magnitude of passing current. In an internal high voltage mode generating a regulated voltage Vreg using the pumping voltage Vpp_pump, the comparator 150 generates the second switch control signal CNTL2 so as to turn on the second switch 130 with relatively large magnitude of passing current. Throughout the above-described operations, the occurrence of the overshoot and the ripple can be restrained in the regulated voltage Vreg even when receiving the external high voltage Vpp_ext. The voltage divider 140 and the comparator 150 constitute a switch control circuit for controlling the first and second switches 120 and 130 in response to the mode select signal Mode_sel and the regulated voltage Vreg.

The decoder 200 selects a word line WL of a memory cell array 300 in response to an address ADD, and supplies the regulated voltage Vreg regulated by the first switch 120 or the second switch 130 to the selected word line WL. The memory cell array 300 includes a plurality of memory cells MC arranged at intersections of word lines WL and bit lines BL which are arranged in row and column directions, respectively. As the regulated voltage Vreg is supplied to the selected word line WL through the decoder 200, a program operation, a program verify operation, a reading operation, etc. of the flash memory device will be performed in a well-known manner. However, the regulated voltage Vreg is not limited to the word line voltage only. That is, the regulated voltage Vreg may be supplied as various driving voltages in the memory device. It is well known to those skilled in the art that the regulated voltage Vreg may be supplied to a bit line, a bulk, etc., so that it can be used for other operations besides the programming operation.

Control logic 400 generates a mode selection signal Mode_sel to select between an external high voltage mode (for example, an accelerated program mode) and an internal high voltage mode (for example, a normal operation mode) in response to an external command or the sensing of an internal operation. However, when the internal pumping voltage Vpp_pump is maintained at a predetermined level that is substantially equal to the external high voltage Vpp_ext during the internal high voltage mode, the control logic 400 may control the comparator 150 so as to select the first switch 120. The control logic 400 receives a level detection result of the internal pumping voltage Vpp_pump from a level detector 500, and then controls the comparator 500.

The level detector 500 detects the level of the internal pumping voltage Vpp_pump and provides the detection result to the control logic 400. The level detector 500 detects whether the internal pumping voltage Vpp_pump has been already boosted so that it has a voltage level equal or correspondent to the external high voltage Vpp_ext in the internal high voltage mode. Alternatively, the level detector 500 can detect whether the internal pumping voltage Vpp_pump is equal or greater than a predetermined voltage level. In either case, the level detector 500 is a device for detecting whether or not a sufficiently high voltage is secured and can be supplied in the internal high voltage mode As described above, in the external high voltage mode when high current is inputted, the voltage regulator 100 of the present invention generates the regulated voltage Vreg through the first switch 120 with low switching current. On the other hand, in the internal high voltage mode, the voltage regulator 100 of the present invention is constructed such that the regulated voltage Vreg is generated through the second switch 130. Accordingly, it is possible to remove the overshoot and the ripple of the regulated voltage Vreg in the external high voltage mode.

Figure 3A:
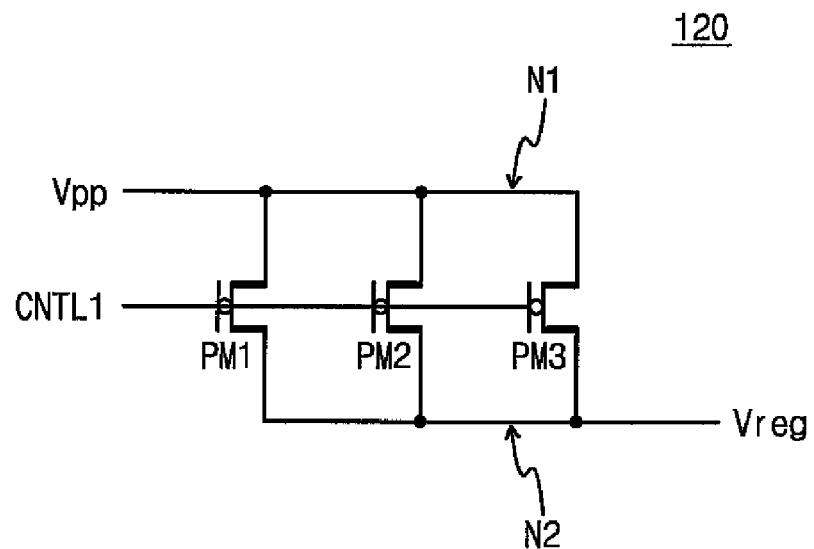
FIG. 3A is a circuit diagram illustrating a constitution of a first switch of FIG. 2 according to an embodiment of the present invention.
Figure 3B:
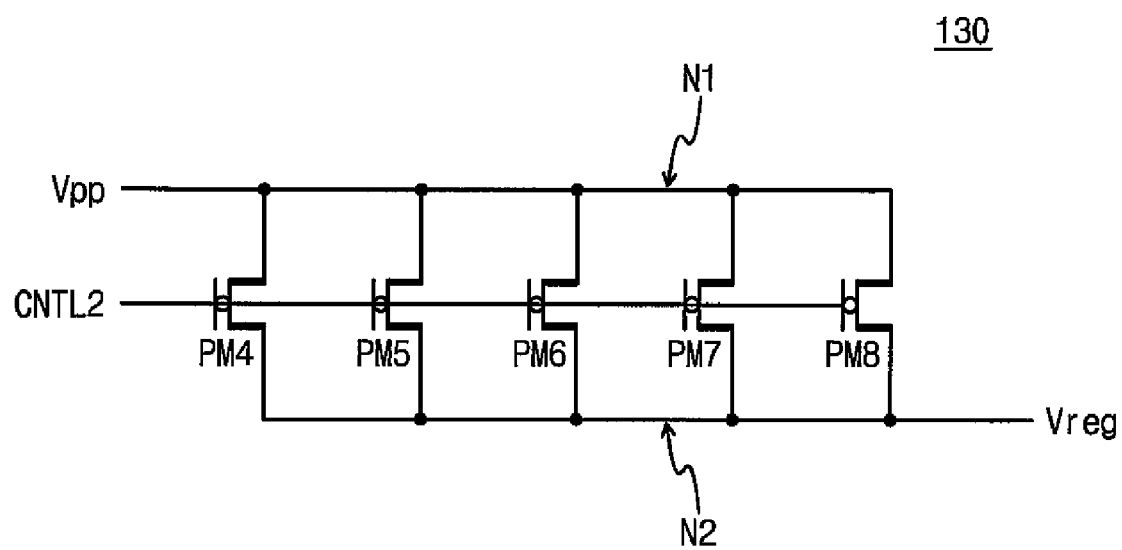
FIG. 3B is a circuit diagram illustrating a constitution of a second switch of FIG. 2 according to an embodiment of the present invention.

FIGS. 3A and 3B are circuit diagrams illustrating constitutions of the first and second switches 120 and 130 of FIG. 2, respectively, according to embodiments of the invention. Referring to FIG. 3A, the first switch 120 is configured with a plurality of switches, e.g., three PMOS high voltage switches PM1, PM2, and PM3, which are arranged in parallel between the first node N1 and the second node N2. Each of the PMOS high voltage switches PM1, PM2, and PM3 is switched in response to the first switch control signal CNTL1. By contrast, referring to FIG. 3B, the second switch 130 is configured with a plurality of switches, e.g., five PMOS high voltage switches PM4, PM5, PM6, PM7, and PM8, which are connected in parallel between the first node N1 and the second node N2. Respective gates of the PMOS high voltage switches PM4~PM8 are connected to the second switch control signal CNTL2 such that they are switched at substantially the same time. Each of the PMOS high voltage switches constituting the first and second switches 120 and 130 is a transistor formed by the same process. Therefore, ideally, each transistor has the same aspect ratio and the same magnitude of passing current when it is turned on. Since the first switch 120 has fewer PMOS transistors than the second switch 130, the magnitude of the current (i.e., switching current) flowing through the first switch 120 is not equal to the magnitude of current (i.e., switching current) flowing through the second switch 130. That is, the magnitude of current flowing into the second node N2 from the first node N1 differs according to each mode.

Variations to the embodiments illustrated in FIGS. 3A and 3B are possible. For example, the number of the PMOS transistors constituting the first and second switches 120 and 130 are not limited to the embodiments described above. However, the number of the PMOS transistors constituting the first switch 120 may be set to limit overshoot due to the switching current when external high voltage Vpp_ext is applied. In addition, the first and second switches 120 and 130 need not be constructed with PMOS high voltage switches having the same structure, even though doing so may simplify the semiconductor fabrication process. Moreover, the first switch 120 and the second switch 130 can each be constructed from a single switching device so long as the magnitude of switching current differs between switch 120 and switch 130.

Figure 4:
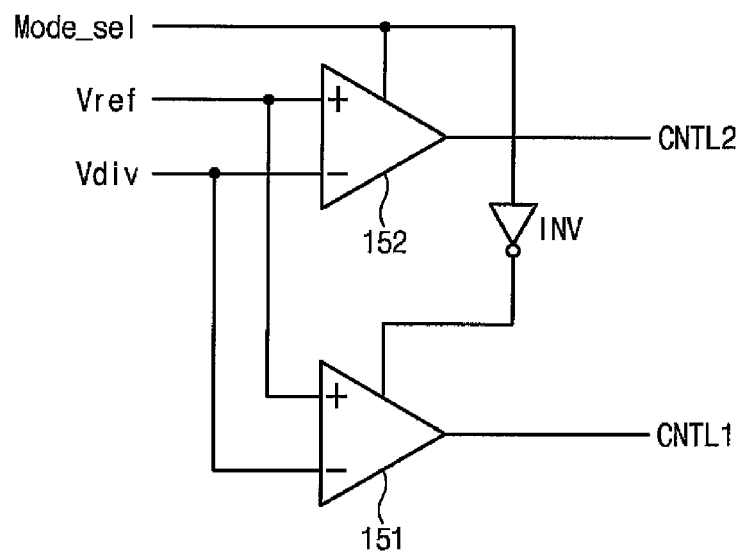
FIG. 4 is a circuit diagram illustrating a first embodiment of a comparator according to the present invention.

FIG. 4 is a circuit diagram illustrating a first embodiment of the comparator 150 of FIG. 2. Referring to FIG. 4, the comparator 150 according to the first embodiment of the present invention includes respective comparison circuits operating in each high voltage mode. In other words, there are provided the comparison circuits which respectively operate during the external high voltage mode when the external high voltage Vpp_ext is supplied and during the internal high voltage mode when the pumping voltage Vpp_pump is supplied.

The first comparison circuit 151 is activated when the mode select signal Mode_sel indicates the external high voltage mode, and outputs the first switch control signal CNTL1 after comparing the divided voltage Vdiv with the reference voltage Vref. If the divided voltage Vdiv is smaller than the reference voltage Vref, the first comparison circuit 151 outputs the first switch control signal CNTL1 at a low level, activating the switch 120. On the contrary, when the divided voltage Vdiv is greater than the reference voltage Vref, the first comparison circuit 151 outputs the first switch control signal CNTL1 at a high level, which results in turning off the first switch 120.

Meanwhile, the second comparison circuit 152 is activated when the mode select signal Mode_sel indicates the internal high voltage mode. The second comparison circuit 152 compares the divided voltage Vdiv with the reference voltage Vref, and outputs the second switch control signal CNTL2. When the divided voltage Vdiv is smaller than the reference voltage Vref, the second comparison circuit 152 outputs the second switch control signal CNTL2 at a low level to activate the switch 130. On the contrary, when the divided voltage Vdiv is greater than the reference voltage Vref, the second comparison circuit 152 outputs the second switch control signal CNTL2 at a high level, which deactivates the second switch 130.

Alternatively, the comparator 150 may be configured such that it generates the first and second switch control signals CNTRL1 and CNTRL2 using a single comparator. For instance, the comparison result generated through the single comparator may be outputted as the first switch control signal CNTRL1 or the second switch control signal CNTRL2 according to the mode select signal.

Figure 5:
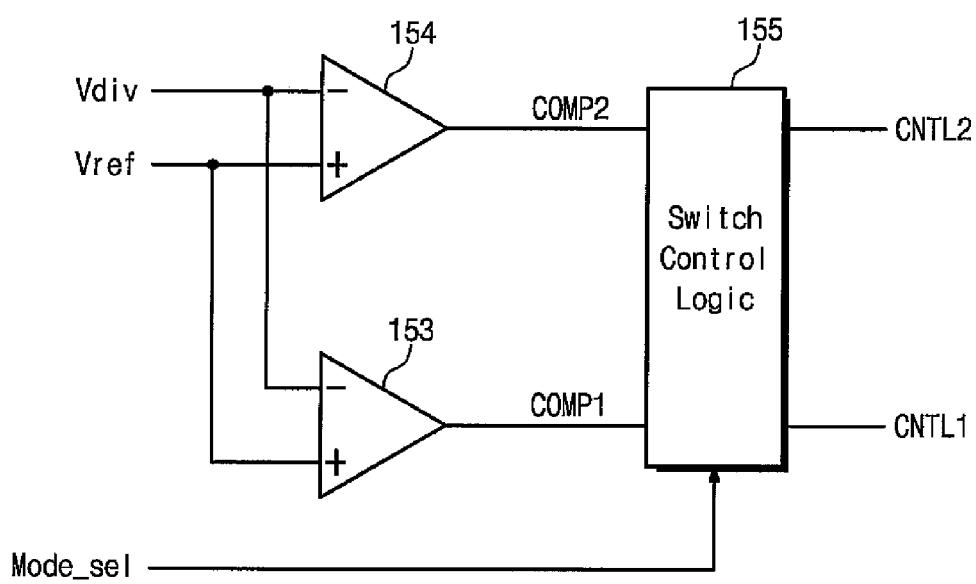
FIG. 5 is a circuit diagram illustrating a second embodiment of a comparator according to the present invention.

FIG. 5 is a circuit diagram of the comparator 150 according to the second embodiment of the present invention. Referring to FIG. 5, the comparator 150 according to the second embodiment of the present invention includes a third comparison circuit 153, a fourth comparison circuit 154 and switch control logic 155. In the external high voltage mode, both the third and fourth comparison circuits 153 and 154 are activated, and the switch control logic 155 activates both the first and second switches 120 and 130 in sequence. This sequential switch control operation can substantially remove the overshoot and the ripple of the regulated voltage Vref in the external high voltage mode, and can further stabilize regulated voltage Vreg when unexpected high current is consumed.

The third and fourth comparison circuits 153 and 154 are configured to be activated regardless of mode. Therefore, the third comparison circuit 153 compares the divided voltage Vdiv with the reference voltage Vref to output a first comparison signal COMP1. The fourth comparison circuit 154 compares the divided voltage Vdiv with the reference voltage Vref to output a second comparison signal COMP2.

The switch control logic 155 outputs the first comparison signal COMP1 and/or the second comparison signal COMP2 as the switch control signal CNTL1 and CNTL2 in response to the mode select signal Mode_sel. When the mode select signal Mode_sel indicates the internal high voltage mode, the switch control logic 155 outputs the second comparison signal COMP2 as control signal CNTRL2 to control the second switch 130. However, in the external high voltage mode, the switch control logic 155 turns on the first switch 120 (having relatively small magnitude of passing current), and then turns on the second switch 130 (having relatively large magnitude of passing current) after the lapse of a predetermined time. In this case, the switch control logic 155 is set such that the overshoot can be reduced when the external high voltage Vpp_ext is initially applied, and the stable regulated voltage Vreg can also be maintained when the unexpected high current is consumed.

Different operations of the present invention can be realized on the basis of the switch control logic 155 and the voltage selection circuit 110. For example, in the external high voltage mode described with reference to FIG. 5, the voltage selection circuit 100 can be controlled to supply external voltage Vpp_ext to node N1 during the time that switch 120 alone is activated, and to supply both external voltage Vpp_ext and internal pump voltage Vpp_pump to node N1 during the time that switch 120 and switch 130 are both activated.

Figure 6A:
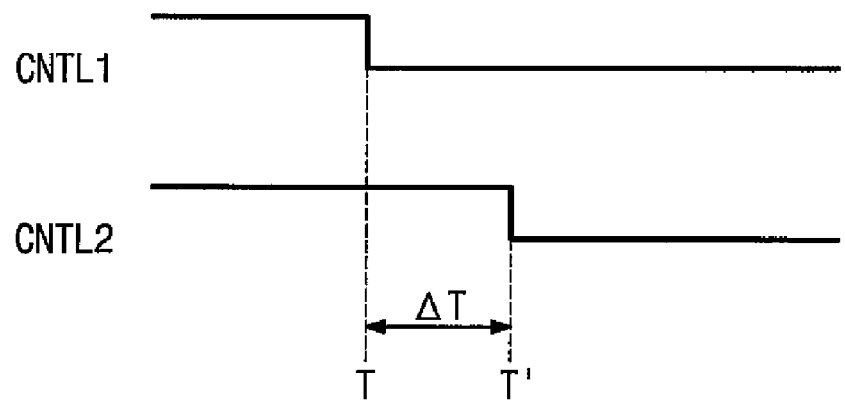
FIG. 6A is a timing diagram illustrating one example of an output of a switch control logic of FIG. 5.

FIG. 6A is a timing diagram illustrating an operation of the switch control logic 155 of FIG. 5. Referring to FIG. 6A, in the external high voltage mode, the switch control logic 155 activates the first switch control signal CNTL1 (from HIGH to LOW) at a time T such that the first switch 120 with small magnitude of passing current is turned on. The first switch 120 is turned on in response to the first switch control signal CNTL1, and the charges accumulated at the first node N1 are supplied to the second node N2. After a predetermined time ΔT, in which the overshoot and the ripple due to the external high voltage Vpp_ext are removed, the switch control logic 155 activates the second switch control signal CNTL2 (from HIGH to LOW) at a time T'.

Figure 6B:
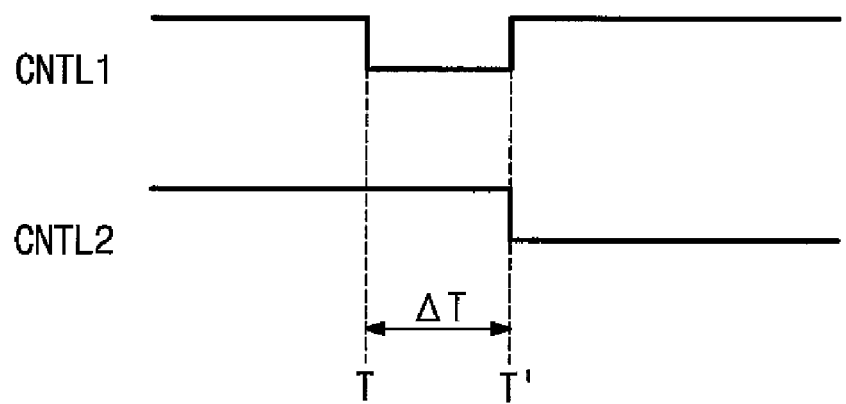
FIG. 6B is a timing diagram illustrating another example of an output of a switch control logic of FIG. 5.

FIG. 6B is a timing diagram illustrating another operation of the switch control logic 155 of FIG. 5. Referring to FIG. 6B, in the external high voltage mode, the switch control logic 155 activates the first switch control signal CNTL1 (from HIGH to LOW) at a time T such that the charges accumulated at the first node N1 are supplied to the second node N2. After the lapse of time ΔT the switch control logic 155 can then deactivate the first switch 120 and activate the second switch 130 to provide a more stable regulated voltage Vreg. For this operation, the switch control logic 155 deactivates the first switch control signal CNTL1 (from LOW to HIGH) at a point T', and simultaneously activates the second switch control signal CNTL2 (from HIGH to LOW).

According to the alternative operations of the switch control logic 155 illustrated in FIGS. 6A and 6B, the voltage regulator 100 of the present invention can sequentially turn on the switches 120 and 130 when high current is supplied. Alternatively, the switch control logic 155 may turn on the first switch 120 for only an initial set-up time ΔT when the external high voltage Vpp_ext is supplied, thereby controlling the regulated voltage Vreg without the overshoot and the ripple. After completing the setting-up of the regulated voltage Vreg during time ΔT, the first switch 120 can be turned off and the second switch 130 can be turned on. In addition, it is possible to achieve reliability and stability by providing the external high voltage Vpp_ext and the internal pumping voltage Vpp_pump to node N1 at the same time.

Hereinafter, the overall operation of the voltage regulator according to the present invention will be illustrated for each embodiment with reference to FIGS. 2 through 6. The first embodiment is the voltage regulator 100 adopting the comparator 150 of FIG. 4, and the second embodiment is the voltage regulator 100 adopting the comparator 150 of FIG. 5. In the first embodiment, only one switch and one comparison circuit are activated in each mode. In the second embodiment, the first switch 120 and the second switch 130 are sequentially turned on during the external high voltage mode.

In the first embodiment, when the control logic 400 outputs the mode select signal Mode_sel so as to receive the external high voltage Vpp_ext, the voltage selection circuit 110 transfers the external high voltage Vpp_ext to the first node N1. The first comparison circuit 151 activates the first switch control signal CNTL1. The electric charges, which are accumulated at the first node N1 to form high voltage Vpp, charge the second node N2 to the regulated voltage Vreg using the first switch 120. At this time, the voltage divider 140 divides Vreg by an appropriate value, and provides the divided voltage Vdiv to the first comparison circuit 151. The first comparison circuit 151 compares the divided voltage Vdiv with the reference voltage Vref, and generates the first switch control signal CNTL1. When the divided voltage Vdiv is lower than the reference voltage Vref, the first comparison circuit 151 outputs the first switch control signal CNTL1 so as to turn on the first switch 120. Through such an operation, it is possible to remove the overshoot and the ripple of the regulated voltage Vreg which may occur in the external high voltage mode. However, in the internal high voltage mode, the voltage selection circuit 110 supplies the pumping voltage Vpp_pump to the first node N1 and the second comparison circuit 152 is activated. In this case, the second switch 130 is activated, and the current from the first node N1 is supplied to the second node N2.

According to the second embodiment, the voltage selection circuit 110 sequentially supplies the external high voltage Vpp_ext and the internal pumping voltage Vpp_pump to the first node N1 in the external high voltage mode. In addition, the comparator 150 activates the first switch control signal CNTL1 and the second switch control signal CNTL2 in sequence to thereby control the first switch 120 and the second switch 130 to be sequentially turned on. It is preferable that the voltage selection circuit 100 supply the internal pumping voltage Vpp_pump together with the external high voltage Vpp_ext after the predetermined set-up time ΔT. However, the voltage selection circuit 110 may supply the external high voltage Vpp_ext only to the first node N1 in the external high voltage mode. In the internal high voltage mode, the voltage selection circuit 110 supplies the internal pumping voltage Vpp_pump only to the first node N1 and activates only the second switch 130.

Figure 7:
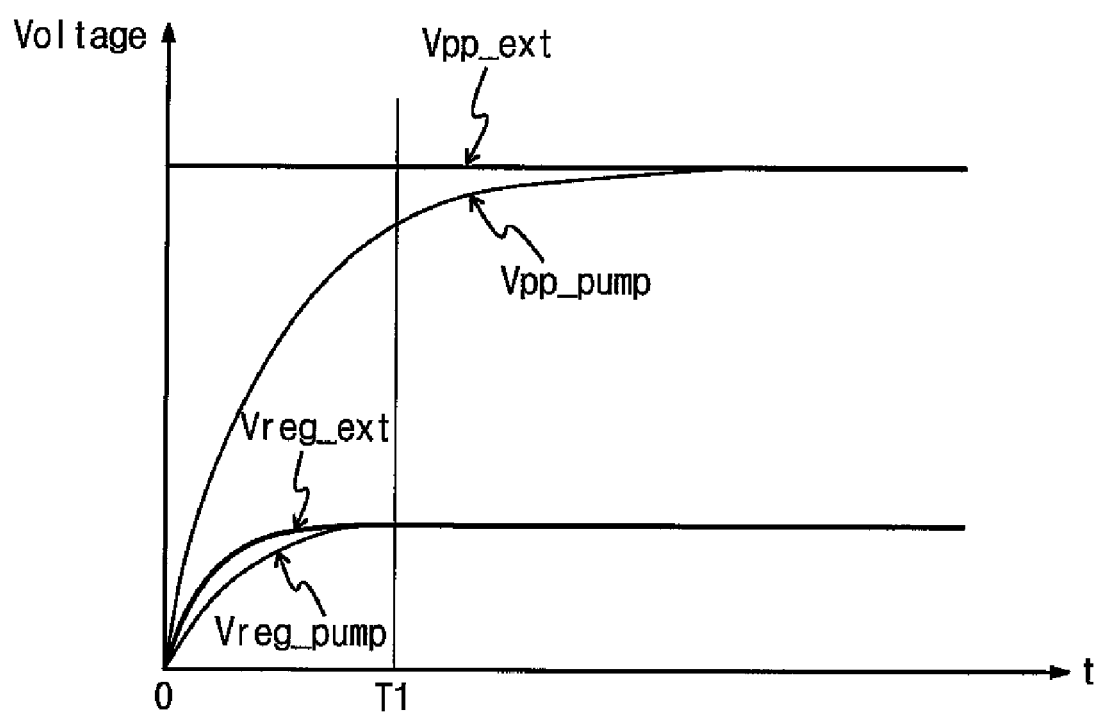
FIG. 7 is a waveform diagram illustrating a regulated voltage of the voltage regulator according to an embodiment of the present invention.

FIG. 7 illustrates a waveform diagram of the regulated voltage Vreg outputted through the second node N2 of the voltage regulator 100, according to an embodiment of the invention. Referring to FIG. 7, the regulated voltage Vreg_ext, which is generated when the external high voltage mode is selected, has a gradually ascending slope in comparison with the conventional case, but it has a waveform where the overshoot and the ripple are substantially removed. The voltage regulator according to each of the embodiments of the present invention is advantageous in that it can effectively remove the overshoot and the ripple which may occur at an initial stage when the external high voltage Vpp_ext is applied.

The removal of the overshoot and the ripple by the voltage regulator 100 according to the present invention can prevent the number of iterations of a program loop from being increased and also can reduce verification error in program verify operation. Accordingly, it is possible to enhance the operational speed and reliability of the semiconductor memory device.

The present invention is not limited to the disclosure herein. For example, each of the switches 120 and 130 may have the same number of PMOS transistors. For example, in this case, it is possible to differently set the current drivabilities (or the amount of switching current) of the switches 120 and 130 by differently setting low-level voltages of the switch control signals CNTL1 and CNTL2.

As described above, a voltage regulator of a semiconductor memory device according to the present invention can prevent an overshoot and a ripple which may occur when an external voltage is applied. Therefore, a stable regulated voltage can be provided so that it is possible to improve the operational speed and reliability of the semiconductor memory device.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A voltage regulator of a flash memory device, the voltage regulator configured to output a regulated voltage, the voltage regulator comprising:
    a selection circuit configured to receive and selectively output at least one of an external high voltage and an internal pumping voltage, the selection being in response to a mode signal;
    a first switch coupled to an output of the selection circuit, the first switch having a first switching current;
    a second switch coupled to the output of the selection circuit, the second switch having a second switching current, the second switching current being different from the first switching current; and
    a switch control circuit coupled to the first switch and the second switch, the switch control circuit configured to select at least one of the first switch and the second switch in response to the mode signal, the switch control circuit further configured to control the at least one selected switch according to the regulated voltage.

2. The voltage regulator of claim 1, wherein each of the first and second switches comprises a plurality of PMOS transistors connected in parallel between the output of the selection circuit and the regulated voltage.

3. The voltage regulator of claim 2, wherein the plurality of PMOS transistors of the first switch is smaller in number than the plurality of PMOS transistors of the second switch, and the first switching current is lower than the second switching current.

4. The voltage regulator of claim 1, wherein the switch control circuit comprises:
    a voltage divider configured to divide the regulated voltage to output a divided voltage; and
    a comparator coupled to the voltage divider, the comparator to configured to compare the divided voltage to a reference voltage.

5. The voltage regulator of claim 4, wherein the comparator comprises:
    a first comparison circuit coupled to the first switch, the first comparison circuit configured to be activated in response to the mode signal, the first comparison circuit configured to activate the first switch according to whether the divided voltage is greater than the reference voltage; and
    a second comparison circuit coupled to the second switch, the second comparison circuit configured to be activated in response to the mode signal, the second comparison circuit configured to activate the second switch according to whether the divided voltage is greater than the reference voltage.

6. The voltage regulator of claim 5, wherein the first comparison circuit is configured to be activated when the mode signal is associated with an accelerated program mode of the flash memory device, and the second comparison circuit is configured to be activated when the mode signal is associated with a normal operation mode of the flash memory device, the accelerated program mode being different than the normal operation mode.

7. The voltage regulator of claim 4, wherein the comparator comprises:
    a first comparison circuit coupled to the first switch, the first comparison circuit configured to activate the first switch according to whether the divided voltage is greater than the reference voltage; and
    a second comparison circuit coupled to the second switch, the second comparison circuit configured to activate the second switch according to whether the divided voltage is greater than the reference voltage; and
    a switch control logic coupled to the first comparison circuit and the second comparison circuit, the switch control logic operating in response to the mode signal.

8. The voltage regulator of claim 1, wherein the first switching current is lower than the second switching current and the switch control logic is configured to select the first switch for a first time duration and the first and second switch during a second time duration, the first time duration immediately proceeding the second time duration, when the mode signal is associated with an accelerated program mode of the flash memory device.

9. The voltage regulator of claim 8, wherein the first time duration is a time taken for the regulated voltage to reach a predetermined level without an overshoot.

10. The voltage regulator of claim 1, wherein the first switching current is lower than the second switching current and the switch control logic is configured to select the second switch and deselect the first switch when the mode signal is associated with a normal operation mode of the flash memory device, the normal operation mode being different than an accelerated program mode.

11. The voltage regulator of claim 1, wherein the regulated voltage is an internal operation voltage of the flash memory device.

12. The voltage regulator of claim 11, wherein the regulated voltage is a word line voltage.

13. The voltage regulator of claim 11, wherein the regulated voltage is any one of a program voltage, a program verify voltage and a readout voltage of the flash memory device.

14. The voltage regulator of claim 11, wherein the regulated voltage is one of a bit line voltage and a bulk voltage of the flash memory device.

15. The voltage regulator of claim 1, wherein the first switching current is lower than the second switching current.

16. The voltage regulator of claim 15, further comprising a mode control logic coupled to the selection circuit and the switch control circuit, the mode control logic configured to generate the mode signal.

17. The voltage regulator of claim 16, the mode signal indicating one of a first operational mode and a second operational mode, the switch control circuit configured to select the first switch in response to the first operational mode, the switch control circuit configured to select the second switch in response to the second operational mode.

18. The voltage regulator of claim 17, wherein the mode control logic is configured to output the mode signal indicating the first operational mode when the internal pumping voltage has a voltage level that is equal to or greater than a predetermined voltage level.

19. The voltage regulator of claim 17, wherein the mode control logic is configured to output the mode signal indicating the second operational mode when the internal pumping voltage has a voltage level that is less than the predetermined voltage level.

20. The voltage regulator of claim 17, wherein, the mode control logic is configured to output the mode signal indicating the first operational mode when the internal pumping voltage has a voltage level that is substantially equal to a voltage level of the external high voltage.

* * * * *